United States Patent [19]

Ryczek et al.

[11] Patent Number: 5,502,373
[45] Date of Patent: Mar. 26, 1996

[54] MAGNETO-OPTICAL CURRENT MEASUREMENT APPARATUS

[75] Inventors: Lawrence J. Ryczek, Oconomowoc; Ruth E. Hubbell, Milwaukee, both of Wis.

[73] Assignee: Eaton Corporation, Cleveland, Ohio

[21] Appl. No.: 260,138

[22] Filed: Jun. 15, 1994

[51] Int. Cl.⁶ ............................................. G01R 31/00
[52] U.S. Cl. ............................................. 324/96; 324/117 R
[58] Field of Search .......................... 324/96, 117 R, 324/244, 244.1; 250/231.1, 227.21, 225

[56] References Cited

U.S. PATENT DOCUMENTS

| | | | |
|---|---|---|---|
| 4,147,979 | 4/1979 | Baues et al. | 324/244 |
| 4,539,519 | 9/1985 | Ulrich et al. | 324/117 R |
| 4,540,937 | 9/1985 | Asars | 324/96 |
| 4,613,811 | 9/1986 | Vaerewyck et al. | 324/96 |
| 4,683,421 | 7/1987 | Miller et al. | 324/96 |
| 4,698,497 | 10/1987 | Miller et al. | 250/231 R |
| 4,973,899 | 11/1990 | Jones et al. | 324/96 |
| 5,008,525 | 4/1991 | Petronio | 250/214 C |
| 5,021,647 | 6/1991 | Tatsuno et al. | 250/227.21 |
| 5,051,577 | 9/1991 | Lutz et al. | 250/227.17 |
| 5,136,235 | 8/1992 | Brandle et al. | 324/96 |
| 5,212,446 | 5/1993 | Itoh et al. | 324/244.1 |

*Primary Examiner*—Kenneth A. Wieder
*Assistant Examiner*—Kourosh Cyrus Khosravi
*Attorney, Agent, or Firm*—Quarles & Brady

[57] ABSTRACT

An electric current is measured by a device that includes a magneto-optical element which acts as a Faraday rotator wherein a plane of polarization of polarized light passing therethrough is rotated as a function of a magnetic field surrounding that element. A light emitter and polarizer send a polarized light beam through the magneto-optical element. First and second light detectors are located within the single beam of light emerging from the magneto-optical element. Associated with the two detectors are separate polarizers respectively oriented at −45 degrees and +45 degrees to a polarization plane of the light beam emerging from the magneto-optical element when no electric current flows through the conductor. The magnitude of the current in the conductor is determined by comparing signals from the two light detectors.

15 Claims, 1 Drawing Sheet

MAGNETO-OPTICAL CURRENT MEASUREMENT APPARATUS

BACKGROUND OF THE INVENTION

The present invention relates to devices for measuring electrical current flowing through a conductor, and more particularly to such apparatus which include a magneto-optical element that makes use of the Faraday effect.

Very large electrical currents typically are measured by an apparatus which does not have to be electrically connected to the circuit through which the current flows. One type of such a current measuring apparatus transmits a polarized beam of light through a transparent medium that exhibits the Faraday effect. Because of that effect, the plane of polarization of the light beam rotates by an amount proportional to the magnetic field passing through the substance parallel to the optical axis of the light beam. Magneto-optical materials exhibiting the Faraday effect are commercially available.

U.S. Pat. No. 5,051,577 discloses an example of a current sensor that takes advantage of the Faraday effect in which an optical fiber is wound in a coil around the electrical conductor carrying the current to be measured. A beam of polarized light is transmitted from one end of the fiber to the other end where the polarization of the light is detected. The detection end of the fiber typically is connected to an optical splitter which divides the beam into two orthogonally polarized component beams. Specifically, the polarization axis of one of the output beams was at an angle of +45° to the polarization axis of the input light into the optical fiber, and the other output beam was polarized at an angle of −45° with respect to the polarization axis of the input beam. By detecting the relative intensity of the two output beams, the magnitude of the rotation due to the Faraday effect can be determined. That amount of rotation corresponds to the magnitude of current flowing through the conductor.

Such magneto-optical current sensors have several advantages in that their speed of response allows relatively fast current pulses to be measured. Furthermore, the sensors are constructed from di-electric materials, which is very important when operating at high voltage or in the presence of substantial electro-magnetic interference. However, previous magneto-optical current sensors were relatively expensive requiring optical fibers which can be wrapped around the conductor. Furthermore, because the relatively long optical fiber carried a light beam having a small cross sectional area, laser light sources were used to generate a beam for transmission through the optical fiber. The narrow output beam that emerged from the fiber necessitated an expensive splitter to divide the output beam into two beams of orthogonal polarization. It is therefore desirable to eliminate the use of as many of the expensive sensor components as possible.

SUMMARY OF THE INVENTION

An object of the present invention is to provide a magneto-optical apparatus for measuring electric current.

Another object is to provide a magneto-optical apparatus with a relatively inexpensive light source.

A further object of the present invention is to provide a magneto-optical current sensor which does not require an optical splitter.

An electric current measuring system according to the present invention comprises a magneto-optical element that acts as a Faraday rotator that rotates a plane of polarization of polarized light passing through the element as a function of the intensity of a surrounding magnetic field. A conductor for carrying electric current to be measured is adjacent to the magneto-optical element and preferably is wound around that element.

A light emitter, such as a light emitting diode, produces a beam of light that is directed through the magneto-optical element. An input optical polarizer is positioned between the light emitter and the magneto-optical element to polarize the beam of light.

First and second light detectors are located within the same light beam that emerges from the magneto-optical element. A first output optical polarizer is between the first light detector and the magneto-optical element, and has an axis of polarization oriented at −45 degrees to a polarization plane of a light beam that emerges from the magneto-optical element when electric current is not passing through the conductor. A second output optical polarizer is between the magneto-optical element and the second light detector, and has a polarization axis oriented at +45 degrees to the polarization plane of the light beam emerging from the magneto-optical element when electric current is not passing through the conductor.

The electrical signals produced by the first and second light detectors can be compared to determine the amount that the plane of polarization of the light beam has rotated within the magneto-optical element. This amount of rotation corresponds to the magnitude of electric current flowing through the conductor. Thus the signal comparison provides a measurement of that current magnitude.

The present magneto-optical current measurement apparatus offers several advantages of previous current sensors of that type. Because the light does not travel through a relative long optical fiber coiled around the conductor, a laser does not have to be employed as the light source. Instead a much less expensive light emitting diode may be used. Further, a wider light beam is used in the present apparatus enabling both light detectors to be placed in the single light beam emerging from the magneto-optical element. This further reduces the cost by eliminating the need for a splitter that produced separate light beams for multiple detectors in previous apparatus.

Yet another object of the present invention is to provide an embodiment of the magneto-optical current sensor which can be fabricated on a single printed circuit board. In this version, one end of the magneto-optical element is reflective. The emitter at the opposite end sends the light beam toward the one end where the light is reflected back to the pair of detectors also located at the opposite end. Since the emitter and detectors are at the same end of the magneto-optical element, they can be mounted on a single printed circuit board.

DESCRIPTION OF THE PREFERRED EMBODIMENTS

Figure 1:
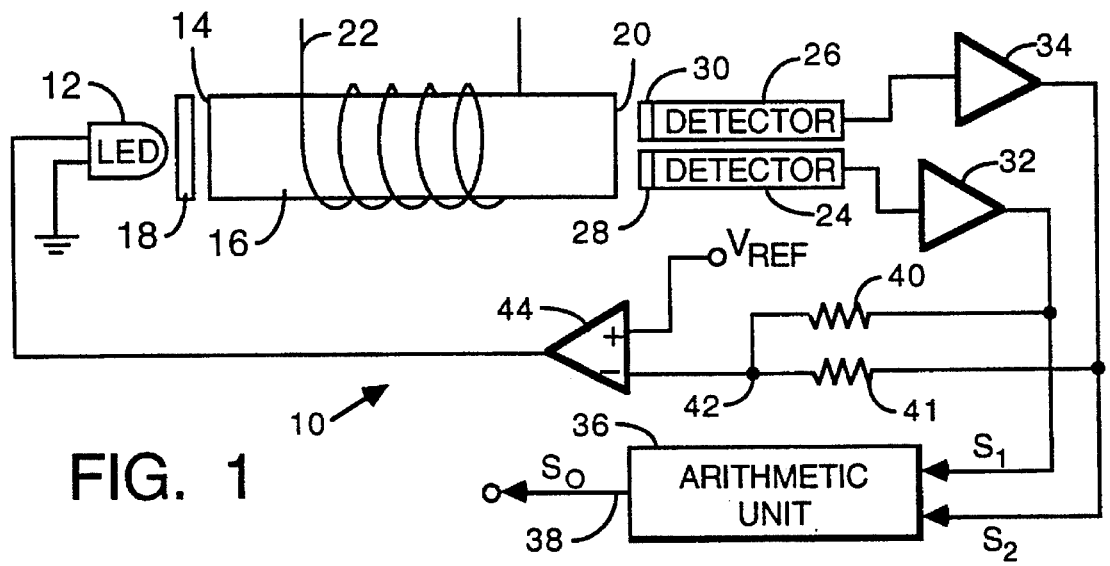
FIG. 1 is a block diagram of a magneto-optical current measuring apparatus according to the present invention.

With initial reference to FIG. 1, a magneto-optical current measuring apparatus 10 comprises a light emitting diode (LED) 12 adjacent one end 14 of a magneto-optical element 16 into which a beam of light is transmitted. Either the LED 12 has an integral diffuser lens or a separate low cost diffuser can be inserted between the LED and the end 14 of the magneto-optical element 16 in order to produce a beam of light having a relatively wide cross section. An input polarizer 18, such as a polarizing filter, is located between the LED 12 and the magneto-optical element 16. The polarizer 18 passes only the light from LED 12 that is polarized along a polarization axis $I_{IN}$ so that all of the light from the LED 12 that enters the magneto-optical element 16 will be polarized along that axis.

The magneto-optical element 16 is a transparent material with the property such that the plane of polarization of light passing through the element rotates through a small angle which is a function of the magnitude of a magnetic field within which the element is located. For example, the magneto-optical element 16 can be SF57 type glass manufactured by the Schott Glass Company. This polarized beam of light passes through the magneto-optical element 16 from first end 14 to an opposite second end 20.

A conductor 22 carries an electric current that is to be measured by apparatus 10. This conductor 22 is coiled around the magneto-optical element 16 with the center of the coil being parallel to or co-axial with a longitudinal axis of the magneto-optical element. Thus a magnetic field produced by current flowing through the conductor will be parallel to the optical axis of the light beam. A cylindrical magneto-optical element 16 can have a slot cut around its curved surface to receive conductor 22. Alternatively, the conductor can be wound on a bobbin which is slipped over element 16.

A pair of photodetectors 24 and 26 are adjacent to the second end 20 of the magneto-optical element 16. The two photodetectors 24 and 26 are located within the same beam of light emerging from the second end 20 of the magneto-optical element 16 and thus receive that light without having to split the beam into individual output beams. Separate output polarizing filters 28 and 30 are attached to photodetectors 24 and 26 so that the photodetectors respond only to light having a particular polarization. Specifically photodetectors 24 and 26 are oriented with respect to each other so that their filter's polarization axes $O_1$ and $O_2$ are orthogonal to each other and at 45° with respect to the polarization axis $I_{IN}$ of the input light beam entering the first end 14 of the magneto-optical element 16. In particular, the polarization axis $O_1$ of the first output polarizing filter 28 is oriented at −45° with respect to the polarization axis $I_{IN}$ of the input light beam, and the second polarizing filter 30 is oriented so that its polarization axis $O_2$ is oriented at +45° with respect to the polarization axis $I_{IN}$. The attachment of the output polarizing filter 28 and 30 to the photodetectors 24 and 26 prevents relative movement between each set of components.

Each photodetector 24 and 26 produces a signal having a voltage which corresponds to the intensity of light impinging thereon, and thus indicate the relative intensity of light polarized along the polarization axes of filters 28 and 30. The signals from the first and second photodetectors 24 and 26 are amplified by amplifiers 32 and 34, respectively. The amplified signals are provided as inputs to an arithmetic unit 36 which produces an output signal on line 38 that indicates the intensity of the electric current flowing through conductor 22.

When an electric current is not flowing through conductor 22, the polarized beam of light from LED 12 passes through the magneto-optical element 16 without having its plane of polarization rotated. Therefore, when the beam emerges from the second end 20, its plane of polarization will lie 45° in between the polarization axes $O_1$ and $O_2$ of the first and second output filters 28 and 30. In this case, equal amounts of light will be passed by those filters 28 and 30 onto their respective photodetectors 24 and 26. Thus, input signals $S_1$ and $S_2$ of equal magnitude are applied to the arithmetic unit 36. The arithmetic unit 36 derives the output signal $S_O$ according to the following expression:

$$S_o = \frac{S1 - S2}{S1 + S2}$$

Thus, when current is not flowing through the conductor 22 and rotation of the light beam polarization does not occur, a zero level output signal $S_O$ will be produced by the arithmetic unit 36 since the input signals $S_1$ and $S_2$ are of equal magnitude.

When current is flowing through the conductor 22, the magnetic field generated by the conductor produces a rotation of the polarization plane of the light beam flowing through the magneto-optical element 16. The amount of the rotation is proportional to the intensity of the electric current and the direction of the rotation indicates the direction of the instantaneous current flowing through the conductor 22. Therefore, the instantaneous magnitude of the output signal $S_O$ from the arithmetic unit 36 corresponds to the instantaneous magnitude of the current flowing through conductor 22.

The apparatus 10 also includes a feedback mechanism which holds the light intensity from LED 12 constant. The amplified detector signals $S_1$ and $S_2$ also are applied through resistors 40 and 41 to a summing node 42. Thus, resistors 40 and 41 and summing node 42 act as an adder so that the voltage at the summing node corresponds to the arithmetic sum of signals $S_1$ and $S_2$. The inverting input of an operational amplifier 44 is connected to summing node 42 and the non-inverting input of the operational amplifier is connected to a reference voltage $V_{REF}$. The output of the operational amplifier 44 is coupled to drive the light emitting diode 12. By summing the output signals from the two photodetectors 24 and 26 and referencing the sum against a fixed reference voltage to control the LED, the level of light from the LED 12 is held constant over time. Thus the sum of the two photodetector output signals also will be constant enabling accurate measurement of the electrical current.

Because the two photodetectors 24 and 26 are aligned with the longitudinal axis of the magneto-optical element 16, both photodetectors receive light from the single beam passing through the element. Therefore, there is no need to utilize a relatively expensive beam splitter to divide the output beam from the magneto-optical element 16 into separate beams, for each of the photodetectors. By diffusing the light from LED 12, either by a diffused surface on the LED or the use of a separate diffuser device, a relatively wide cross section beam is sent through the magneto-optical element 16 allowing the two photodetectors 24 and 26 to fit within the spot size of the beam. In addition, by coiling the conductor 22 around the magneto-optical element 16, the necessity of using a coiled optical fiber has been eliminated. Since coils of wire are relatively inexpensive as compared to optical fibers, this too has reduced the cost of the present apparatus 10 over other types of magneto-optical current sensors.

Figure 2:
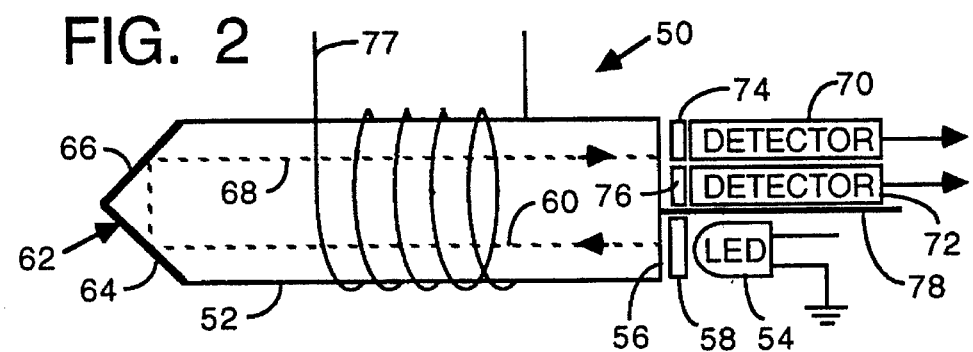
FIG. 2 is an alternative embodiment of a portion of the device in FIG. 1.

FIG. 2 shows a dual-pass current sensing apparatus 50 according to the present invention, in which the light beam passes twice through the length of the magneto-optical element 52. An LED 54 with a diffusing lens surface is located adjacent one end 56 of the magneto-optical element 52 with a polarizing filter 58 therebetween. A diffused beam of light from the LED is polarized by filter 58 and travels along a first path 60 through the magneto-optical element 52 to a second end 62.

The second end 62 of the magneto-optical element 52 has two facets 64 and 66 with reflective surfaces at right angles to one another and each at a 45° angle to the longitudinal axis through the magneto-optical element. Thus when the light beam traveling along path 60 strikes the first facet 64, it is reflected at a 90° angle toward the second facet 66 where it is reflected at another 90° angle back toward the first end 56. The light beam then travels along a second path 68 through the magneto-optical element 52. The two longitudinal paths 60 and 68 are spaced apart from one another and intersect the first end 56 at two different locations. The light beam is reflected at a total of 180° at the second end 62, thus reversing its polarity. Therefore, when the beam passes in the opposite direction along path 68 through the magneto-optical element 52, although the rotation of the optical beam will be in the opposite direction to the rotation that occurred along the first path 60, the reversal of polarity allows the rotational effects to be additive.

The light beam traveling along path 68 exits the magneto-optical element 52 at the first end 56, passes through polarizing elements 74 and 76 and strikes photodetectors 70 and 72. Both photodetectors 70 and 72 are located in the same light beam exiting the magneto-optical element 52. As with the first embodiment in FIG. 1, the polarization axes of the two filters 74 and 76 are oriented orthogonally to each other, and at +45° and −45° to the plane of polarization of the light beam that passes through the magneto-optical element 52 when current is not flowing through conductor 77. A light barrier 78 is placed between the LED and the two photodetectors 70 and 72 so that light cannot be transmitted directly between these components, but must pass through the magneto-optical element. The output signals produced by the two photodetectors 70 and 72 are processed by the same type of circuit as is used with the previously described embodiment shown in FIG. 1.

The second embodiment of the present invention has the advantage that all of the electrical components are located at the same end of the magneto-optical element 52 and thus can be easily mounted on a single printed circuit board.

We claim:

1. A magneto-optical electric current measuring system (10 or 50) comprising:
    a conductor (22 or 77) for carrying electric current to be measured;
    a magneto-optical element (16 or 52) adjacent to said conductor, and acting as a Faraday rotator which rotates a plane of polarization of polarized light passing through said magneto-optical element as a function of the electric current carried by said conductor;
    a light emitter (12 or 54) for generating a light beam that is directed through said magneto-optical element;
    an input optical polarizer (18 or 58) located between said light emitter (12 or 54) and said magneto-optical element (16 or 52) to polarize the light beam;
    first and second light detectors (24 and 26, or 70 and 72) located within a single beam of light emerging from said magneto-optical element;
    a first output optical polarizer (28 or 74) located between said magneto-optical element (16 or 52) and said first light detector (24 or 70), and having a polarization axis that is oriented at −45 degrees to a plane of polarization of the light beam emerging from said magneto-optical element when electric current is not passing through said conductor; and
    a second output optical polarizer (30 or 76) located between said magneto-optical element (16 or 52) and said second light detector (26 or 72), and having a polarization axis that is oriented at +45 degrees to a plane of polarization of the light beam emerging from said magneto-optical element when electric current is not passing through said conductor.

2. The magneto-optical electric current measuring system as recited in claim 1 wherein the conductor is wound around said magneto-optical element.

3. The magneto-optical electric current measuring system as recited in claim 1 wherein said first output optical polarizer is attached to a surface of said first light detector; and said second output optical polarizer is attached to a surface of said second light detector.

4. The magneto-optical electric current measuring system recited in claim 1 wherein said light emitter comprises a light emitting diode with a light diffusing mechanism.

5. The magneto-optical electric current measuring system as recited in claim 1 wherein said first light detector produces a first electrical signal S1 representing a first sensed intensity of light, and said second light detector produces a second electrical signal S2 representing a second sensed intensity of light; and further comprising a circuit which in connected to said first and second light detectors for producing an output signal So indicating a magnitude of current flowing through the conductor, wherein the output signal is related to said first and second electrical signals according to the expression:

$$So = \frac{S1 - S2}{S1 + S2}$$

6. The magneto-optical electric current measuring system as recited in claim 1 wherein said circuit further comprises an adder for adding the first and second electrical signals to produce a summed signal; and a comparator that compares the summed signal to a reference level and produces an output signal that controls said light emitter.

7. The magneto-optical electric current measuring system as recited in claim 1 wherein said magneto-optical element has first and second ends; and said light emitter is located adjacent to the first end and said first and second light detectors are located adjacent to the second end.

8. The magneto-optical electric current measuring system as recited in claim 1 wherein said magneto-optical element has first and second ends, wherein said first and second light detectors and said light emitter are located adjacent to said first end, and said second end has two reflective facets each at an acute angle to a longitudinal axis of said magneto-optical element to reflect the light beam from said light emitter back toward said first and second light detectors.

9. A magneto-optical electric current measuring system comprising:
    a magneto-optical element with first and second ends, and acting as a Faraday rotator to rotate a plane of polarization of polarized light passing through said magneto-optical element as a function of a magnetic field in which said magneto-optical element is located;
    a conductor wound around said magneto-optical element for carrying electric current to be measured;
    a light emitting diode which generates a beam of light that is directed through said magneto-optical element from the first end to the second end;

an input optical polarizer located between said light emitting diode and said magneto-optical element to polarize the beam of light;

first and second light detectors both of which located within a single light beam emerging from the second end of said magneto-optical element;

a first output optical polarizer attached to said first light detector, and having a polarization axis that is oriented at −45 degrees to a plane of polarization of the light beam emerging from said magneto-optical element when electric current is not passing through said conductor; and a second output optical polarizer attached to said second light detector, and having a polarization axis that is oriented at +45 degrees to a plane of polarization of the light beam emerging from said magneto-optical element when electric current is not passing through said conductor.

10. The magneto-optical electric current measuring system as recited in claim 9 wherein said first light detector produces a first electrical signal representing a first sensed intensity of light, and said second light detector produces a second electrical signal representing a second sensed intensity of light; and further comprising an adder for adding the first and second electrical signals to produce a summed signal; and a comparator that compares the summed signal to a reference level and produces an output signal that is coupled to control said light emitting diode.

11. The magneto-optical electric current measuring system as recited in claim 9 further comprising a light diffusing mechanism between a source of light in said light emitting diode and said magneto-optical element.

12. A magneto-optical electric current measuring system comprising:

a magneto-optical element with first and second ends wherein the second end has a reflective surface so that light travelling from the first end is reflected at the second end back to the first end, and said magneto-optical element acts as a Faraday rotator to rotate a plane of polarization of polarized light passing through said magneto-optical element as a function of a magnetic field in which said magneto-optical element is located;

a conductor wound around said magneto-optical element for carrying electric current to be measured;

a light emitting diode which generates a beam of light that is directed into said magneto-optical element at the first end;

an input optical polarizer located between said light emitting diode and said magneto-optical element to polarize the beam of light;

first and second light detectors both of which located within a single light beam emerging from the first end of said magneto-optical element;

a first output optical polarizer attached to said first light detector, and having a polarization axis that is oriented at −45 degrees to a plane of polarization of the light beam emerging from said magneto-optical element when electric current is not passing through said conductor; and a second output optical polarizer attached to said second light detector, and having a polarization axis that is oriented at +45 degrees to a plane of polarization of the light beam emerging from said magneto-optical element when electric current is not passing through said conductor.

13. The magneto-optical electric current measuring system as recited in claim 12 wherein the second end of said magneto-optical element has two reflective facets each at 45 degrees to a longitudinal axis of said magneto-optical element to reflect light from said light emitter back toward said first and second light detectors.

14. The magneto-optical electric current measuring system as recited in claim 12 wherein said first light detector produces a first electrical signal representing a first sensed intensity of light, and said second light detector produces a second electrical signal representing a second sensed intensity of light; and further comprising an adder for adding the first and second electrical signals to produce a summed signal, and a comparator that compares the summed signal to a reference level and produces an output signal that is coupled to control said light emitting diode.

15. The magneto-optical electric current measuring system as recited in claim 12 further comprising a light diffusing mechanism between a source of light in said light emitting diode and said magneto-optical element.

\* \* \* \* \*